(12) United States Patent
Sakai

(10) Patent No.: US 10,185,194 B2
(45) Date of Patent: Jan. 22, 2019

(54) DISPLAY CONTROL ELEMENT AND DISPLAY DEVICE

(71) Applicant: Sharp Kabushiki Kaisha, Sakai, Osaka (JP)

(72) Inventor: Tamotsu Sakai, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/543,729

(22) PCT Filed: Jan. 25, 2016

(86) PCT No.: PCT/JP2016/051997
§ 371 (c)(1),
(2) Date: Jul. 14, 2017

(87) PCT Pub. No.: WO2016/121682
PCT Pub. Date: Aug. 4, 2016

(65) Prior Publication Data
US 2018/0011382 A1  Jan. 11, 2018

(30) Foreign Application Priority Data
Jan. 30, 2015  (JP) ................................ 2015-017835

(51) Int. Cl.
*G02F 1/1333*  (2006.01)
*G02F 1/1362*  (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
CPC ............. G02F 1/13454; G02F 1/13439; G02F 1/1368; H01L 29/78696; H01L 29/41733;
(Continued)

(56) References Cited

U.S. PATENT DOCUMENTS

2001/0030719 A1  10/2001  Yamaguchi et al.
2004/0080681 A1*  4/2004  Moon .................. G02F 1/1368
                                                        349/43
(Continued)

FOREIGN PATENT DOCUMENTS

JP          7-311390 A    11/1995
JP       2001-296553 A    10/2001
(Continued)

*Primary Examiner* — Charles Chang
(74) *Attorney, Agent, or Firm* — ScienBiziP, P.C.

(57) ABSTRACT

Provided is a display control element which can improve a display device in driving speed. A display control element (A) includes a semiconductor layer (l) having a counter surface (p) connected to a gate line (GL), a source electrode (s) provided on a side of the semiconductor layer (l) and connected to a source line (SL), and drain electrodes (da and db) provided on the side of the semiconductor layer (l) and connected to the same pixel (P). The gate surface, the source electrode (s), and each of the drain electrodes constitute a single thin film transistor.

10 Claims, 9 Drawing Sheets

(51) Int. Cl.

| | |
|---|---|
| *G02F 1/1368* | (2006.01) |
| *H01L 29/786* | (2006.01) |
| *G02F 1/1343* | (2006.01) |
| *G02F 1/1345* | (2006.01) |
| *H01L 27/12* | (2006.01) |
| *H01L 29/417* | (2006.01) |

(52) U.S. Cl.
CPC ........ *G02F 1/13454* (2013.01); *H01L 27/124* (2013.01); *H01L 27/1255* (2013.01); *H01L 29/41733* (2013.01); *H01L 29/786* (2013.01); *H01L 29/78696* (2013.01); *H01L 29/7869* (2013.01); *H01L 29/78666* (2013.01); *H01L 29/78675* (2013.01)

(58) Field of Classification Search
CPC ................. H01L 29/786; H01L 27/124; H01L 29/78666; H01L 29/78675; H01L 29/7869
See application file for complete search history.

(56) References Cited

U.S. PATENT DOCUMENTS

| | | | |
|---|---|---|---|
| 2007/0126944 A1 | 6/2007 | Kim et al. | |
| 2011/0133194 A1* | 6/2011 | Liu | ................. H01L 27/124 |
| | | | 257/59 |

FOREIGN PATENT DOCUMENTS

| | | |
|---|---|---|
| JP | 2005-175248 A | 6/2005 |
| JP | 2007-156468 A | 6/2007 |

\* cited by examiner

DISPLAY CONTROL ELEMENT AND DISPLAY DEVICE

TECHNICAL FIELD

The present invention relates to a display control element for use in an active matrix display device, and an active matrix display device including such a display control element.

BACKGROUND ART

Patent Literature 1 discloses a liquid crystal display device which (i) is an active matrix display device that employs a thin film transistor (TFT) as its display control element and (ii) carries out field sequential driving.

During the field sequential driving, all pixels of the display device are driven, for each of primary colors (e.g., red, green, blue), in a time-sharing manner. On this account, the display device is particularly required to be driven at a high speed so as to add, for example, white to the primary colors or improve a speed at which an image is displayed, so that a problem such as color breakup is restrained.

Figure 8:
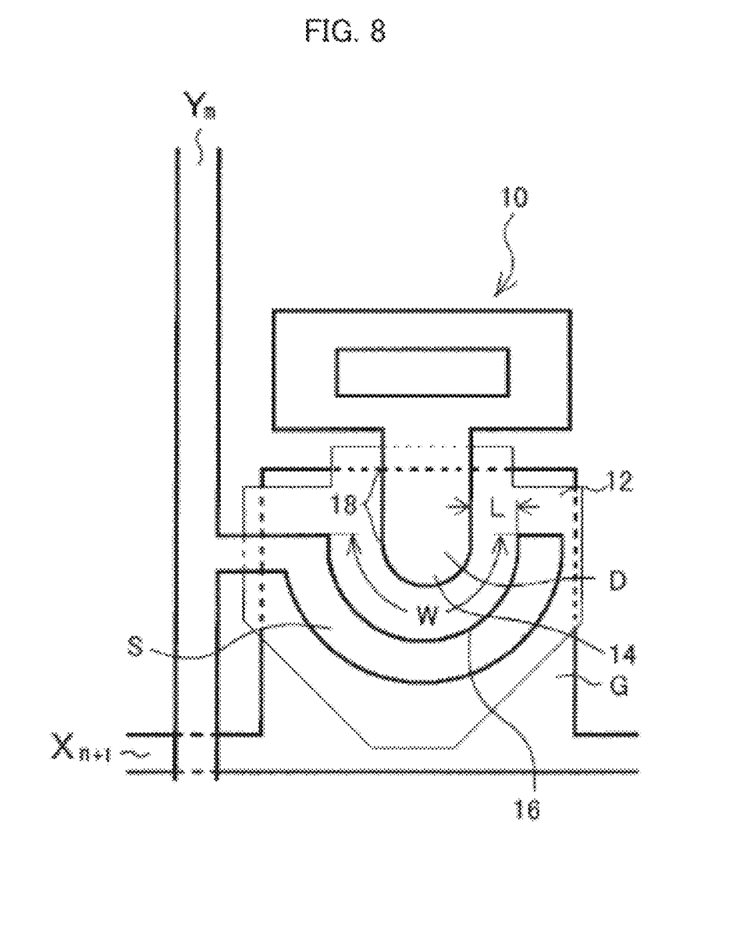
FIG. 8 is a plan view illustrating a configuration of a peripheral part of a TFT disclosed in Patent Literature 1 as a conventional technique.

FIG. 8 is a plan view illustrating a peripheral configuration of a TFT disclosed in Patent Literature 1 as a conventional technique.

As illustrated in FIG. 8, (i) a drain electrode D has a semicircular end part 14 and (ii) a source electrode S has a half-arc end part 16. According to Patent Literature 1, the display device can be driven at a high speed because the above configuration makes it possible to increase an on-current of a TFT without causing an increase in size of the TFT.

Patent Literature 2 discloses a liquid crystal display device in which (i) two pixel electrodes are provided for each "single pixel" and (ii) a TFT is connected to each of the two pixel electrodes as a display control element.

Figure 9:
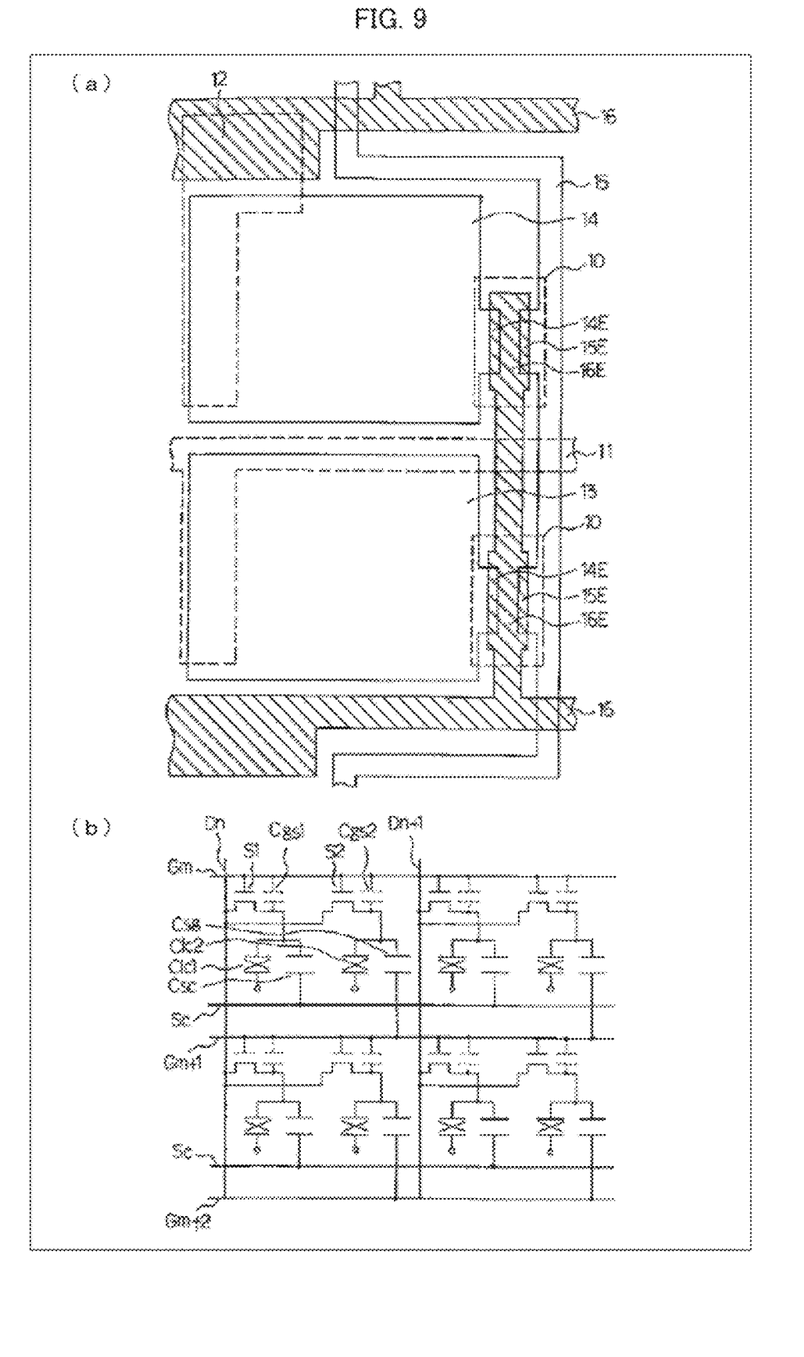
FIG. 9 includes a plan view and a circuit diagram each illustrating a configuration of a peripheral part of a TFT disclosed in Patent Literature 2 as a conventional technique.

FIG. 9 is a view illustrating a peripheral configuration of a TFT disclosed in Patent Literature 2 as a conventional technique. (a) of FIG. 9 is a plan view of the peripheral configuration. (b) of FIG. 9 is a circuit diagram illustrating an equivalent circuit of (a) of FIG. 9.

As illustrated in (a) of FIG. 9, TFTs are connected to corresponding two pixel electrodes 13 and 14. Note that the TFTs are indicated by S1 and S2 in (b) of FIG. 9.

Drains of the respective TFTs S1 and S2 are connected to liquid crystal capacitors C1c1 and C1c2, respectively (see (b) of FIG. 9). That is, according to Patent Literature 2, a "single pixel" is divided into two pixels (i.e., into pixels indicated by the respective liquid crystal capacitors C1c1 and C1c2) so that the two pixels, which substantially serve as the "single pixel", will be driven independently of each other.

CITATION LIST

Patent Literature

[Patent Literature 1]
Japanese Patent Application Publication Tokukai No. 2005-175248 (Publication Date: Jun. 30, 2005)

[Patent Literature 2]
Japanese Patent Application Publication Tokukaihei No. 7-311390 (Publication Date: Nov. 28, 1995)

SUMMARY OF INVENTION

Technical Problem

Patent Literature 1 also describes a parasitic capacitor which is formed between a drain electrode of and a source electrode of a TFT. In order for a display device to be driven at a high speed, it is preferable that such a parasitic capacitor has a small electrostatic capacity.

A configuration disclosed in Patent Literature 1, however, gives no consideration to a parasitic capacitor which is formed between a source electrode of a TFT and a gate line of a display device. Though an increase in channel width W, which is a dimension of a section between a source electrode S and a drain electrode D on a semiconductor layer 12 of a TFT, which dimension is in a direction along opposed surfaces of the respective source electrode S and drain electrode D (see FIG. 8), is likely to contribute to a driving speed of the display device, it also increases an electrostatic capacity of a parasitic capacitor which is formed between the source electrode S of the TFT and a gate line Xn+1. This causes a reduction in speed at which the TFT is turned on and off, and consequently makes it difficult to increase the driving speed of the display device.

A configuration disclosed in Patent Literature 2 gives no consideration to a parasitic capacitor which is formed between a source electrode of a TFT and a gate line of a display device, and it is therefore difficult to increase a driving speed of the display device.

The present invention has been attained to address the above problem, and an objective of the present invention is to provide (i) a display control element which can increase a driving speed of a display device and (ii) a display device, including such a display control element, which can be driven at a high speed.

Solution to Problem

In order to attain the above object, a display control element in accordance with an aspect of the present invention is a display control element which is configured to drive an active matrix display device including source lines and gate lines, the display control element including: a semiconductor layer having a gate surface connected to one of the gate lines; a source electrode provided on a side of the semiconductor layer and connected to one of the source lines; and drain electrodes provided on the side of the semiconductor layer and connected to a same pixel of the active matrix display device, the gate surface, the source electrode, and each of the drain electrodes serving as a gate, a source, and a drain, respectively, so as to constitute a single thin film transistor.

A display device in accordance with another aspect of the present invention includes: source lines; gate lines; pixels; and a display control element discussed above, the gate lines being connected to a gate surface of a semiconductor layer of the display control element, the source lines being connected to a source electrode of the display control element, and the pixels being connected to each of drain electrodes of the display control element.

Advantageous Effects of Invention

A display control element in accordance with an aspect of the present invention brings about an effect of driving a display device at a high speed because it can improve an on-current and reduce an electrostatic capacity of a parasitic capacitor. Particularly, the display control element is suitably applicable to a display device employing a field sequential driving method, which requires high-speed driving.

As has been discussed, it is possible to obtain (i) a display control element which can increase a driving speed of a display device and (ii) a display device, including such a display control element, which can be driven at a high speed.

DESCRIPTION OF EMBODIMENTS

Embodiment 1

Figure 1:
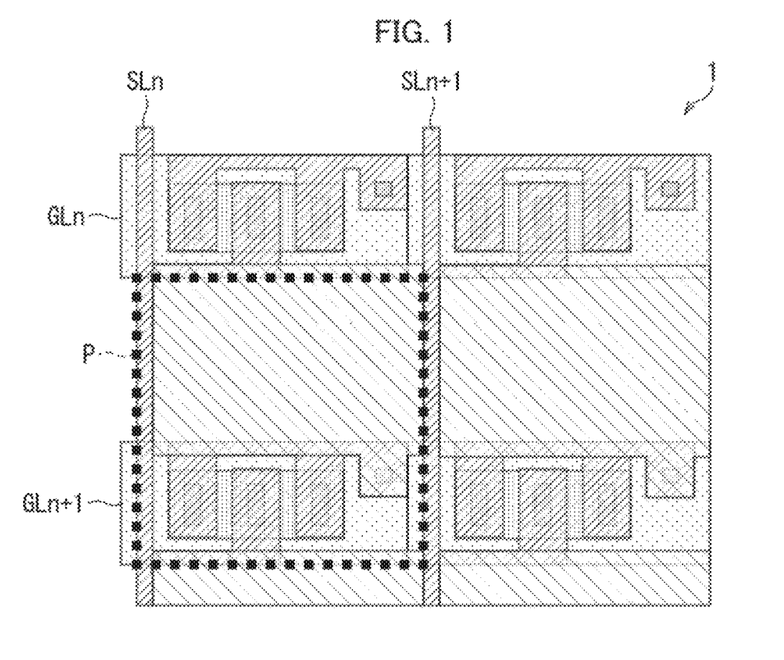
FIG. 1 is a plan view illustrating a configuration of a liquid crystal display device in accordance with Embodiment 1.
Figure 2:
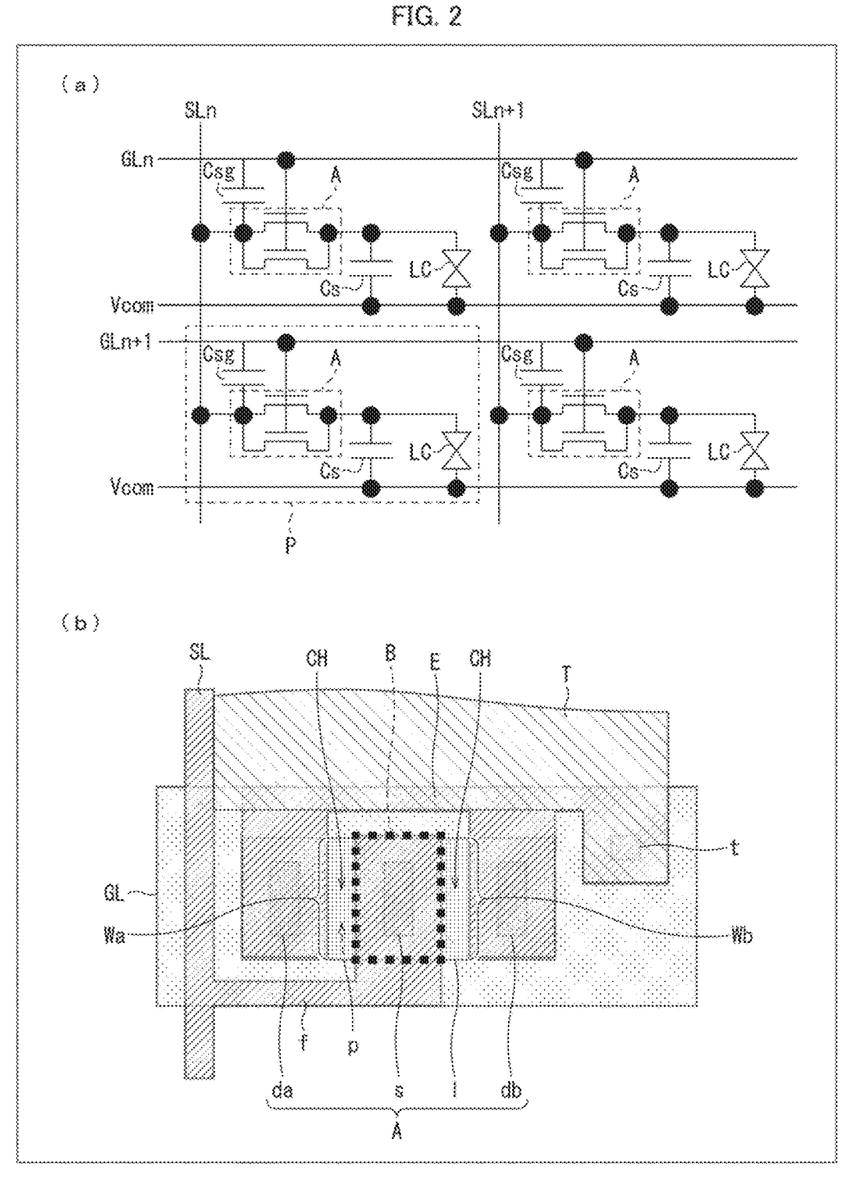
FIG. 2 includes a circuit diagram and a plan view each illustrating in detail a configuration of the liquid crystal display device illustrated in FIG. 1.
Figure 3:
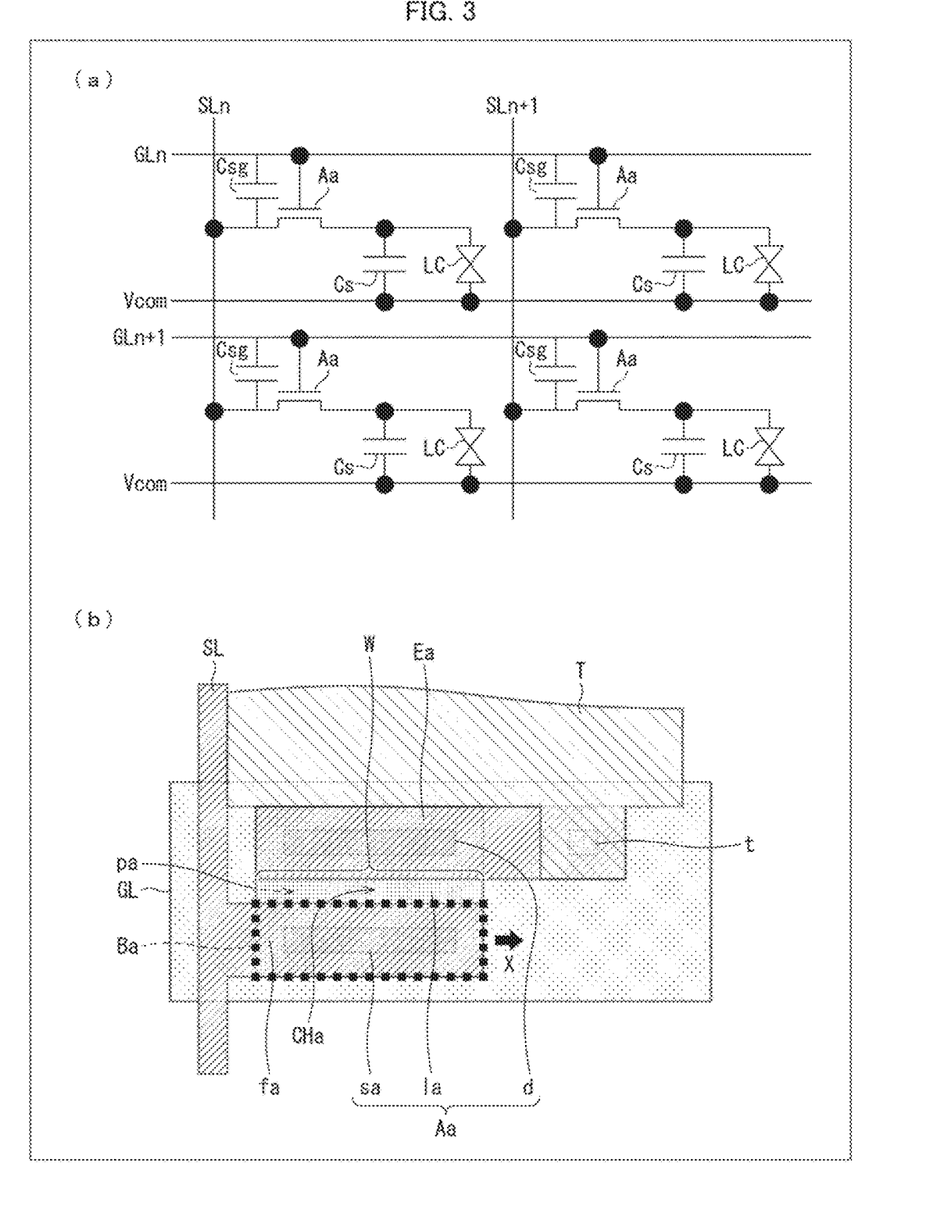
FIG. 3 includes a circuit diagram and a plan view each illustrating a configuration of a comparative example of the liquid crystal display device illustrated in FIG. 2.

The following description will discuss Embodiment 1 of the present invention with reference to FIGS. 1 through 3. Note that members indicated by respective reference numerals in the following description differ from those indicated by respective reference numerals in "Technical Field" and "Technical Problem".

A liquid crystal display device in accordance with Embodiment 1 is suitable for high-speed driving because gates of respective TFTs, included in a display control element for use in the liquid crystal display device, are each driven at a high speed. The following description will specifically discuss such a liquid crystal display device and a display control element.

<<Configuration of Liquid Crystal Display Device>>

FIG. 1 is a plan view illustrating a configuration of a liquid crystal display device 1 in accordance with Embodiment 1.

The liquid crystal display device 1 is an active matrix display device which includes (i) a plurality of source lines SLn and SLn+1, (ii) a plurality of gate lines GLn and GLn+1, and (iii) a plurality of pixel sections P (see FIG. 1).

A broken line in FIG. 1 indicates a single pixel section P. The pixel section P is driven by a source line SLn and a gate line GLn+1. Note that the source line SLn+1 and the gate line GLn drive corresponding a pixel section other than the pixel section P indicated by the broken line in FIG. 1. Note also that the number of and a dimension of each of (i) the source lines, (ii) the gate lines, and (iii) the pixels, included in the liquid crystal display device 1, are determined in accordance with a screen size of and a definition of the liquid crystal display device 1.

(Equivalent Circuit)

FIG. 2 is a diagram illustrating in detail a configuration of the liquid crystal display device 1 illustrated in FIG. 1. (a) of FIG. 2 is a circuit diagram illustrating a configuration equivalent to the liquid crystal display device 1. (b) of FIG. 2 is a plan view illustrating a configuration of a single pixel of the liquid crystal display device 1.

The pixel section P includes a display control element A, an auxiliary capacitor Cs, and a liquid crystal LC (see (a) of FIG. 2).

The display control element A includes two TFTs, each of which has (i) a source electrode which is connected to the source line SLn, (ii) a gate electrode which is connected to the gate line GLn+1, and (iii) a drain electrode which is connected to (a) one end of the auxiliary capacitor Cs and (b) one end of the liquid crystal LC. That is, the two TFTs are connected in parallel to each other.

Examples of a semiconductor layer 1 include amorphous silicon (a-Si), polycrystal silicon (poly-Si), and IGZO (In-GaZnOx: registered trademark) which is an InGaZnOx oxide semiconductor.

Note that the auxiliary capacitor Cs is a capacitor element which contributes to a voltage to be applied across the liquid crystal LC, but is not an essential component.

A line Vcom is a signal line which is connected to (i) the other end of the auxiliary capacitor Cs and (ii) the other end of the liquid crystal LC so that a common potential is applied across the auxiliary capacitor Cs and the liquid crystal LC.

<<Configuration of Liquid Crystal Display Element>>

A display control element A includes (i) a semiconductor layer 1, (ii) a single source electrode s provided on one side of the semiconductor layer 1, and (iii) two drain electrodes da and db provided on the one side of the semiconductor layer 1 (see (b) of FIG. 2). The display control element A is provided on a gate line GL. An end part f, branching off from a source line SL, is connected to the source electrode s.

Note that in (b) of FIG. 2, "SL" indicates a representative of source lines of the liquid crystal display device 1, and "GL" indicates a representative of gate lines of the liquid crystal display device 1.

The source electrode s, the drain electrode da, a counter surface p (gate surface), of the semiconductor layer 1, which faces the gate line GL, and the semiconductor layer 1 function as a single TFT (hereinafter referred to as a "TFTa"). This means that the source electrode s, the drain electrode da, and the counter surface p serve as a source, a drain, and a gate of the TFTa, respectively.

The source electrode s, the drain electrode db, the counter surface p, and the semiconductor layer 1 function as another single TFT (hereinafter referred to as a "TFTb"). This means that the source electrode s, the drain electrode db, and the counter surface p serve as a source, a drain, and a gate of the TFTb, respectively.

The sources of the respective two TFTs are overlaid so as to serve as a single source electrode s.

A channel section CH, which faces the source electrode s and the drain electrode da and db, extends in a direction in which the source line SL extends. The drain electrodes da and db are provided in a direction in which the gate line GL extends.

Each of the drain electrodes da and db is connected, via a connector electrode E, to a transparent pixel electrode T which contains indium tin oxide (ITO). The pixel electrode T relays each liquid crystal LC and the drain electrodes da and db. The connector electrode E and the pixel electrode T are connected via a contact t.

<<Operations and Effects of Display Control Element and Liquid Crystal Display Device>>

With the configuration, the display control element A can drive pixels faster than conventional display control elements. This allows the liquid crystal display device 1, including the display control element A, to be driven at a high speed. This is because of (i) an improvement in on-current of each of the TFTa and TFTb and (ii) a reduction in electrostatic capacity of a parasitic capacitor Csg, as will be later described.

(Channel Width)

An on-current of a TFT is improved in proportion to an increase in channel width, which is a dimension of a section between a source electrode and a drain electrode on a semiconductor layer, which dimension is in a direction along opposed surfaces of the respective source electrode and drain electrode. This makes it possible to drive a display device at a high speed.

In the display control element A, two TFTa and TFTb are provided based on the two drain electrodes da and db, respectively. That is, in the display control element A, the TFTa and TFTb are connected in parallel to each other.

A channel width Wa is a dimension of a section between (i) the end part f connected to the source electrode s and (ii) the connector electrode E connected to the drain electrode da on the semiconductor layer l, which dimension is in a direction along opposed surfaces of the respective end part f and connector electrode E. A channel width Wb is a dimension between (i) the end part f connected to the source electrode s and (ii) the connector electrode E connected to the drain electrode db on the semiconductor layer l, which dimension is in a direction along opposed surfaces of the respective end part f and connector electrode E.

Since the two drain electrodes da and db are connected to the same liquid crystal LC, the on-current is improved in proportion to a total of the channel width Wa of the TFTa and the channel width Wb of the TFTb. Therefore, with the configuration of the display control element A, the on-current is improved as compared with conventional display control elements which do not include a plurality of TFTs.

(Parasitic Capacitor)

In order to drive the liquid crystal display device 1 at a high speed, it is preferable to increase a speed at which the TFTa and TFTb are turned on and off. No conventional liquid crystal display device, however, gives consideration to a parasitic capacitor which is formed between a source electrode of a TFT and a gate line of the liquid crystal display device. It is therefore difficult to drive the liquid crystal display device at a high speed.

The parasitic capacitor corresponds to a capacitor element indicated by Csg in (a) of FIG. 2. The parasitic capacitor Csg is formed in a region indicated by a region B (see (b) of FIG. 2). Note that an electrostatic capacity of the parasitic capacitor Csg is proportional to an area, of the end part f, in the region B. The electrostatic capacity is inversely proportional to a thickness, of the semiconductor layer l, in the region B.

There has been a common demand for a thinner liquid crystal display device. This causes a tendency for the semiconductor layer l to have a smaller thickness. Note that the area, of the end part f, in the region B largely contributes to the electrostatic capacity of the parasitic capacitor Csg. As the electrostatic capacity becomes smaller, the TFTa and TFTb can be turned on and off at a higher speed.

The sources of the respective two TFTa and TFTb are thus overlaid so as to serve as a single source electrode s. This allows a reduction in area of the region B, as compared with a configuration in which the sources of the respective TFTa and TFTb are not overlaid so as to serve as a single source electrode s. This allows a reduction in electrostatic capacity of the parasitic capacitor Csg.

Furthermore, a total area of the source electrode s is made smaller than that of the drain electrodes da and db. This securely allows a reduction in electrostatic capacity of the parasitic capacitor Csg formed between the source electrode and the gate line.

(Compatibility Between Maintenance of Channel Width and Reduction in Electrostatic Capacity of Parasitic Capacitor)

Two TFTs are connected in parallel to each other and sources of the respective two TFTs are overlaid so as to serve as a single source electrode s. This makes it possible to (i) keep the channel width wide and (ii) reduce the electrostatic capacity of the parasitic capacitor.

Note that the number of TFTs included in the display control element A (hereinafter referred to as "the number of parallel TFTs") is not limited to two. Alternatively, the display control element A can include three or more TFTs, provided that (i) such TFTs are connected in parallel to each other and (ii) sources of the respective TFTs are overlaid so as to serve as a single source electrode.

The electrostatic capacity of the parasitic capacitor Csg can be made smaller in proportion to an increase in number of parallel TFTs. The number of parasitic capacitors Csg is equal to the number of display control elements A connected to the source line SL. In a case where the liquid crystal display device 1 is a full high definition (full-HD) display, it includes 1,080 parasitic capacitors Csg. Therefore, as the number of parallel TFTs increases, an effect of reducing the electrostatic capacity of the parasitic capacitor Csg becomes significant.

Note that an increase in number of parallel TFTs also causes an increase in electrostatic capacity of a parasitic capacitor, formed between a drain electrode and a gate line GL of a TFT included in the display control element A. However, such an electrostatic capacity merely contributes to a speed at which a pixel is charged, and will therefore not generally affect a speed at which a gate of a TFT is turned on and off, i.e., the driving speed of the liquid crystal display device 1.

Comparative Example 1

FIG. 3 is a diagram illustrating a configuration of Comparative Example 1 of the liquid crystal display device 1 illustrated in FIG. 2. (a) of FIG. 3 is a circuit diagram illustrating a configuration equivalent to Comparative Example 1. (b) of FIG. 3 is a plan view illustrating a configuration of a single pixel of Comparative Example 1.

A display control element Aa in accordance with Comparative Example 1 includes a single TFT (see (a) of FIG. 3).

The display control element Aa includes (i) a semiconductor layer la, (ii) a single source electrode sa provided on the semiconductor layer la, and (iii) a single drain electrode d provided on the semiconductor layer la. The display control element Aa is provided on a gate line GL. An end part fa, branching off from a source line SL, is connected to the source electrode sa (see (b) of FIG. 3).

The drain electrode d is connected, via a connector electrode Ea, to a transparent pixel electrode T which contains ITO. The pixel electrode T relays each liquid crystal LC and the drain electrode d. The connector electrode Ea and the pixel electrode T are connected via a contact t.

The source electrode sa, the drain electrode d, a counter surface pa, of the semiconductor layer la, which faces the gate line GL, and the semiconductor layer la function as a single TFT. That is, the source electrode sa, the drain electrode d, and the counter surface pa serve as a source, a drain, and a gate of the TFT, respectively.

A parasitic capacitor Csg illustrated in (a) of FIG. 3 is formed in a region indicated by a region Ba (see (b) of FIG. 3). Note that an electrostatic capacity of the parasitic capacitor Csg is proportional to an area, of an end part fa, in the region Ba.

The display control element Aa is not configured such that a plurality of TFTs are connected in parallel to one another. Even through the end part fa is extended in a direction indicated by an arrow X so that a channel width W, which is a dimension of a section between the source electrode sa and the drain electrode d on the semiconductor layer la, which dimension is in a direction along opposed surfaces of the respective source electrode sa and drain electrode d, is increased, an area of the region Ba is also increased. It is therefore not possible to (i) keep the channel width W of a channel section Cha wide and (ii) reduce the electrostatic capacity of the parasitic capacitor Csg.

Comparative Example 2

According to a liquid crystal display device disclosed in Patent Literature 1, a semicircular end part 14 of a drain electrode D is provided inside a half-arc end part 16 of a source electrode S (see FIG. 8). The semicircular end part 14 cannot be provided outside the half-arc end part 16. It is therefore difficult to (i) connect TFTs of a display control element in parallel to each other and (ii) overlay sources of the respective TFTs so as to serve as a single source electrode, unlike the liquid crystal display device 1.

(Other Configuration)

As illustrated in FIG. 1, the pixel section P has a square shape. Note, however, that the pixel section P is not limited to have a square shape. A square pixel section P is suitable for a field sequential display (FSD).

The gate line GL is wider than the source line SL (see (b) of FIG. 2). This allows a reduction in electric resistance of each of the gates of the TFTa and TFTb, and consequently allows an improvement in driving speed of the liquid crystal display device 1. Furthermore, by providing the semiconductor layer l on such a wide gate line GL, it is possible to improve an aperture ratio of the liquid crystal display device 1.

It is possible for the end part f of the source line SL to have a width which is reduced to a minimum value ruled by a design rule of the liquid crystal display device. The electrostatic capacity of the parasitic capacitor Csg can be reduced by reducing the width of the end part f (particularly the region B).

Embodiment 2

Figure 4:
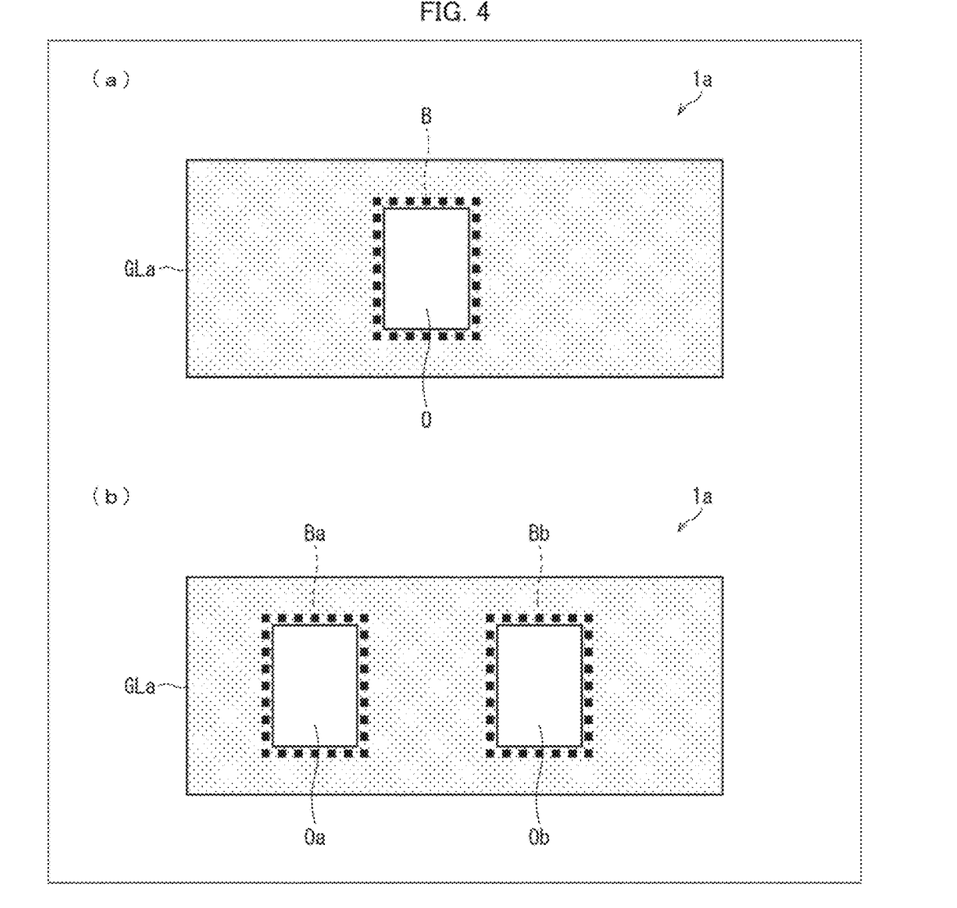
FIG. 4 is a plan view illustrating a configuration of a gate line of a liquid crystal display device in accordance with Embodiment 2.

The following description will discuss Embodiment 2 of the present invention with reference to FIG. 4. Note that members having functions identical to those discussed in Embodiment 1 are given the same reference numerals, and descriptions of such members are omitted. The same applies to Embodiments 3 through 5.

(Gate Line Having Opening)

FIG. 4 is a plan view illustrating a gate line GLa of a liquid crystal display device 1a in accordance with Embodiment 2. (a) of FIG. 4 illustrates a position where an opening O is formed in the gate line GLa. (b) of FIG. 4 illustrates positions where openings Oa and Ob are formed in the gate line GLa.

The liquid crystal display device 1a is configured to include the gate line GLa instead of the gate line GL of the liquid crystal display device 1 (see (a) of FIG. 4). The gate line GLa has the opening O in a region B (see (b) of FIG. 2).

As has been discussed, a parasitic capacitor Csg is formed in the region B (see (a) of FIG. 2). According to the liquid crystal display device 1, the parasitic capacitor Csg in the region B is regarded as a capacitor element in which the end part f and the gate line GLa, serving as respective electrodes, are opposite to each other.

In contrast, the liquid crystal display device 1a is configured such that the gate line GLa has the opening O in the region B. This means that one of opposed electrodes of a capacitor element does not exist. As such, there exists substantially no parasitic capacitor Csg in the region B. This allows a further reduction in electrostatic capacity of the parasitic capacitor Csg.

Note that the gate line GLa has an electric resistance greater than that of the gate line GL. A region, in which the opening O is formed in the gate line GLa, can therefore be made smaller than the region B so that the electric resistance of the gate line GLa will not exceed a given electric resistance.

Alternatively, the gate line GLa can further have an opening Oa in a region Ba and/or an opening Ob in a region Bb (see (b) of FIG. 4).

The region Ba herein refers to a region in which an end part of a connector electrode E covers a semiconductor layer l, the end part being on a drain electrode da side (see (b) of FIG. 2). The region Bb herein refers to a region in which the other end part of the connector electrode E covers the semiconductor layer l, the other end part being on a drain electrode db side (see (b) of FIG. 2).

The above configuration allows a further reduction in electrostatic capacity of the parasitic capacitor Csg.

Embodiment 3

Figure 5:
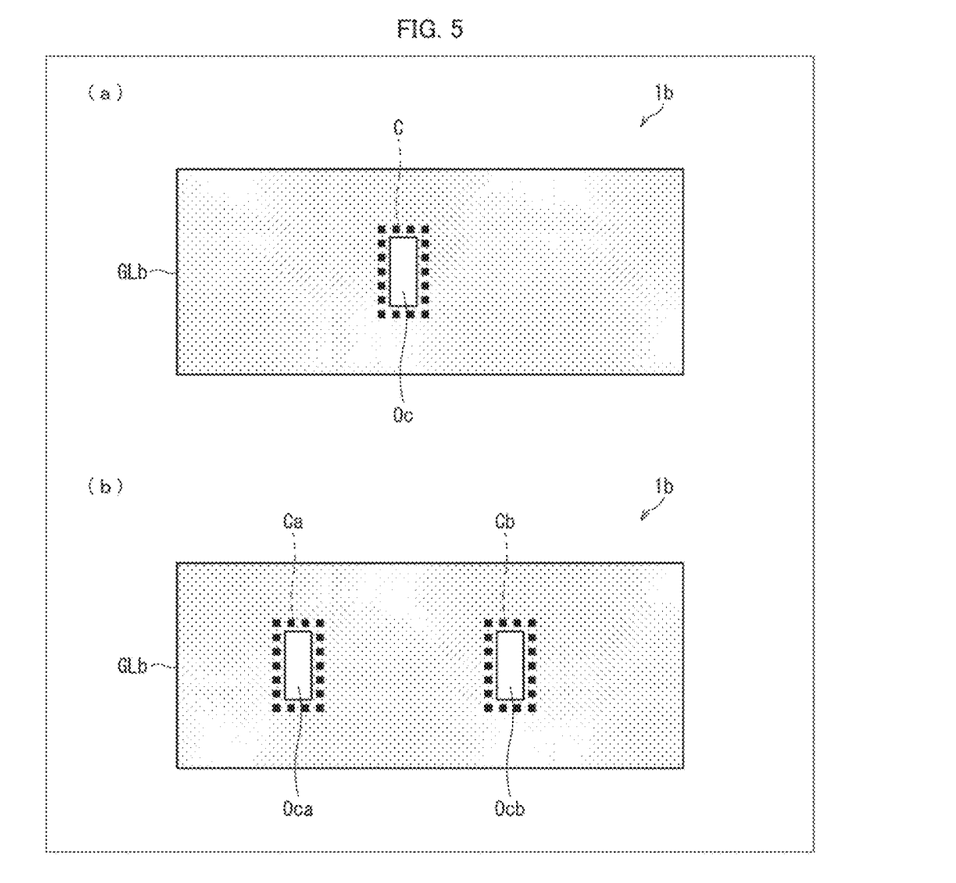
FIG. 5 is a plan view illustrating a configuration of a gate line of a liquid crystal display device in accordance with Embodiment 3.

The following description will discuss Embodiment 3 of the present invention with reference to FIG. 5.

(Gate Line Having Small Opening)

In order to restrain a rise in electric resistance of a gate line GL, it is preferable to form, in the gate line GL, an opening(s) smaller than each of the openings O, Oa, and Ob.

FIG. 5 is a plan view illustrating a configuration of a gate line GLb of a liquid crystal display device 1b in accordance with Embodiment 3. (a) of FIG. 5 illustrates a position where a small opening Oc is formed in the gate line GLb. (b) of FIG. 5 illustrates positions where small openings Oca and Ocb are formed in the gate line GLb.

The liquid crystal display device 1b is configured to include the gate line GLb instead of the gate line GL of the liquid crystal display device 1 (see (a) of FIG. 5). The gate line GLb has the small opening Oc in a region C, in which a source electrode s of the semiconductor layer l is provided. The region C is a region in which an end part f of a source line SL makes contact with the semiconductor layer l.

In a case where the semiconductor layer 1 contains, for example, a-Si or poly-Si and thus needs to be doped, the semiconductor layer 1 is doped in the region C which (i) falls within the region B and (ii) is smaller than the region B. Since an area, in the region B of the semiconductor layer 1, outside the region C is not doped, there is formed substantially no parasitic capacitor Csg. This means that the parasitic capacitor Csg in the region C can be regarded as a capacitor element in which the end part f and the gate line GLb, serving as respective electrodes, are opposite to each other.

In contrast, the liquid crystal display device 1b is configured such that the gate line GLb has the small opening Oc in the region C. This means that one of opposed electrodes of a capacitor element does not exist. As such, there exists substantially no parasitic capacitor Csg. The liquid crystal display device 1b therefore makes it possible to (i) restrain a rise in electric resistance of the gate line GLb and (ii) further reduce an electrostatic capacity of the parasitic capacitor Csg.

Alternatively, the gate line GLb can further have the small opening Oca in a region Ca and/or the small opening Ocb in a region Cb (see (b) of FIG. 5).

The region Ca herein refers to a region in which an end part of a connector electrode E makes contact with the semiconductor layer 1, the end part being adjacent to a drain electrode da (see (b) of FIG. 2). In a case where the semiconductor layer 1 contains, for example, a-Si or poly-Si and thus needs to be doped, the semiconductor layer 1 is doped in the region Ca which (i) falls within the region Ba (see (b) of FIG. 4) and (ii) is smaller than the region Ba.

The region Cb herein means a region in which the other end part of the connector electrode E makes contact with the semiconductor layer 1, the other end part being adjacent to a drain electrode db (see (b) of FIG. 2). In a case where the semiconductor layer 1 contains, for example, a-Si or poly-Si and thus needs to be doped, the semiconductor layer 1 is doped in the region Cb which (i) falls within the region Bb (see (b) of FIG. 4) and (ii) is smaller than the region Bb.

The above configuration makes it possible to (i) further restrict a rise in electric resistance of the gate line GL and (ii) further reduce the electrostatic capacity of the parasitic capacitor Csg.

Embodiment 4

Figure 6:
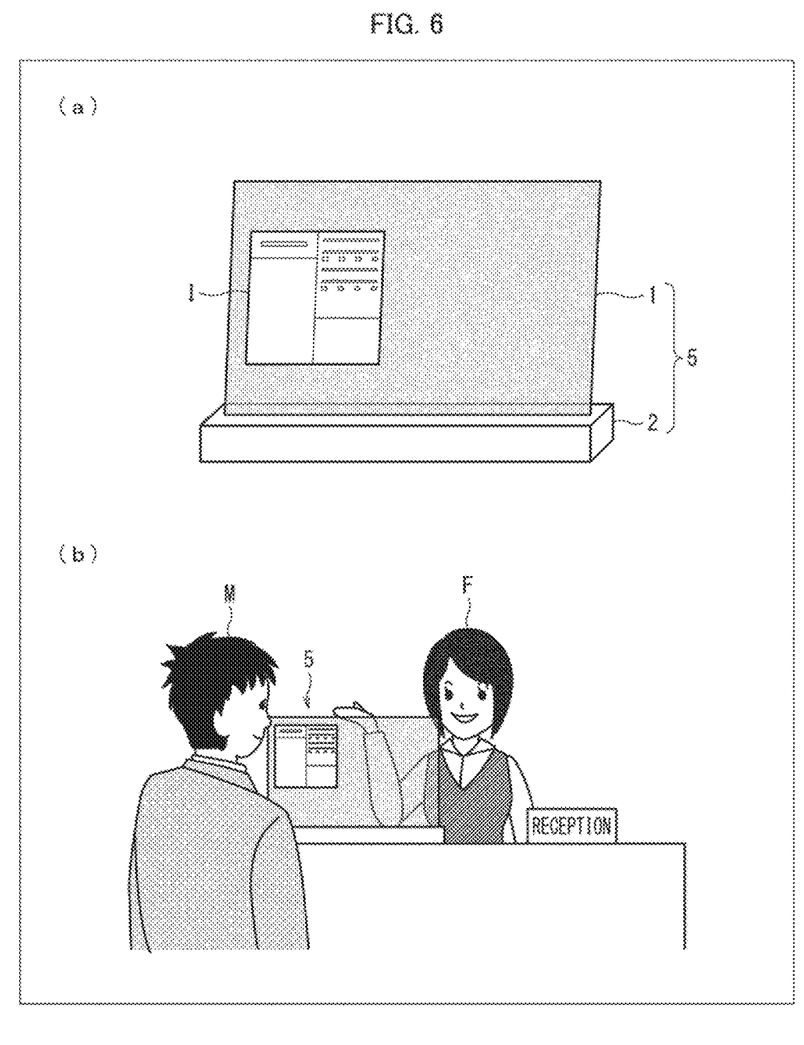
FIG. 6 is a schematic view illustrating a configuration of a transparent display in accordance with Embodiment 4.

The following description will discuss Embodiment 4 of the present invention with reference to FIG. 6.

(Transparent Display)

FIG. 6 is a schematic view illustrating a configuration of a transparent display 5 in accordance with Embodiment 4. (a) of FIG. 6 illustrates an overall configuration of the transparent display 5. (b) of FIG. 6 illustrates an environment where the transparent display 5 can be used.

The transparent display 5 includes a liquid crystal display device 1 and a stand 2 (see (a) of FIG. 6).

The liquid crystal display device 1 includes, for example, an RGB LED as pixels without a color filter, and is driven by a field sequential driving method. Alternatively, the liquid crystal display device 1a or 1b can be employed as the liquid crystal display device 1

The stand 2 houses therein (i) a driver for the liquid crystal display device 1 and (ii) an accessory circuit. Note that the stand 2 is not essential.

The liquid crystal display device 1 is configured such that a display control element A is provided on a gate line GL (see (b) of FIG. 2). Specifically, a semiconductor layer 1 is smaller in dimension, in a direction in which a source line SL extends, than the gate line GL. This causes the liquid crystal display device 1 to have an aperture ratio greater than that of a conventional liquid crystal display device. Furthermore, the liquid crystal display device 1 is more transparent than a conventional liquid crystal display device. This is because a transparent pixel electrode T is provided between the gate line GL and the source line SL.

(Type of Use of Transparent Display)

The transparent display 5 can be installed at, for example, a reception counter (see (b) of FIG. 6). A female F can point at information I, displayed by the transparent display 5, for a male M who faces the female F via the transparent display 5. In so doing, a gesture, made by the female F, of pointing at the information I is visible to the male M without being blocked by the transparent display 5. As such, it is possible to provide a transparent display which (i) causes the male M not to feel odd even though it is installed at a reception counter or the like and (ii) is excellent in design.

Embodiment 5

Figure 7:
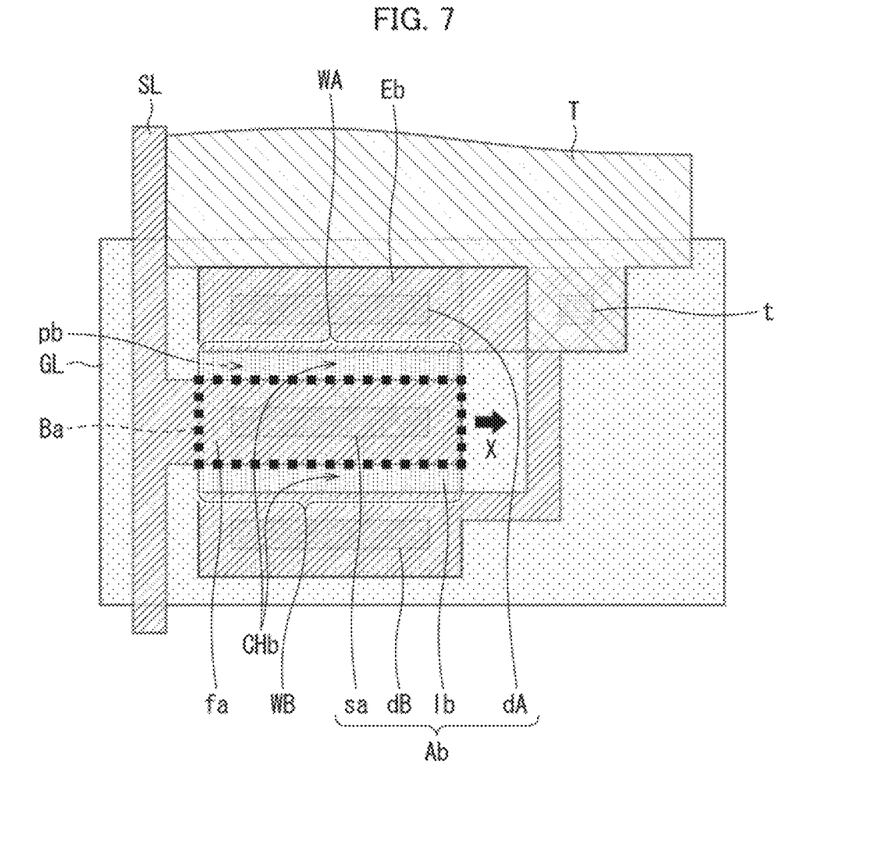
FIG. 7 is a plan view illustrating a configuration of a display control element in accordance with Embodiment 5.

The following description will discuss Embodiment 5 of the present invention with reference to FIG. 7.

<<Configuration of Liquid Crystal Display Element>>

FIG. 7 is a plan view illustrating a configuration of a display control element Ab in accordance with Embodiment 5.

The display control element Ab includes (i) a semiconductor layer 1b, (ii) a source electrode sa provided on one side of the semiconductor layer 1b, and (iii) two drain electrodes dA and dB provided on the one side of the semiconductor layer 1b (see FIG. 7). The display control element Ab is provided on a gate line GL. An end part fa, branching off from a source line SL, is connected to the source electrode sa.

The source electrode sa, the drain electrode dA, a counter surface pb (gate surface), of the semiconductor layer 1b, which faces the gate line GL, and the semiconductor layer 1b function as a single TFT (hereinafter referred to as a "TFT_A"). This means that the source electrode sa, the drain electrode dA, and the counter surface pb serve as a source, a drain, and a gate of the TFT_A, respectively.

The source electrode sa, the drain electrode dB, the counter surface pb, and the semiconductor layer 1b function as another single TFT (hereinafter referred to as a "TFT_B"). This means that the source electrode sa, the drain electrode dB, and the counter surface pb serve as a source, a drain, and a gate of the TFT_B, respectively.

The sources of the respective two TFTs are overlaid so as to serve as a single source electrode sa.

The display control element Ab can be indicated by a circuit equivalent to the display control element A. A circuit equivalent to a liquid crystal display device including the display control element Ab can be indicated as illustrated in (a) of FIG. 2.

A channel section CHb, which faces the source electrode sa and the drain electrodes dA and dB, extends in a direction in which the gate line GL extend. The drain electrodes dA and dB are provided, in a direction in which the source line SL extends.

Each of the drain electrodes dA and dB is connected, via a connector electrode Eb, to a transparent pixel electrode T which contains ITO. The pixel electrode T relays each liquid crystal LC and the drain electrodes dA and dB. The connector electrode Eb and the pixel electrode T are connected via a contact t.

<<Operations and Effects of Liquid Crystal Display Device>>

With the configuration, the display control element Ab can drive pixels faster than conventional display control elements. This allows the liquid crystal display device 1, including the display control element Ab, to be driven at a high speed. This is because, of (i) an improvement in on-current of each of the TFT_A and TFT_B and (ii) a reduction in electrostatic capacity of a parasitic capacitor Csg, as will be later described.

(Channel Width)

In the display control element Ab, two TFT_A and TFT_B are provided based on the two drain electrodes dA and dB, respectively. That is, in the display control element Ab, the TFT_A and TFT_B are connected in parallel to each other.

A channel width WA is a dimension of a section between (i) the end part fa connected to the source electrode sa and (ii) the connector electrode Eb connected to the drain electrode dA on the semiconductor layer lb, which dimension is in a direction along opposed surfaces of the respective end part fa and connector electrode Eb. A channel width WB is a dimension of a section between (i) the end part fa connected to the source electrode sa and (ii) the connector electrode Eb connected to the drain electrode dB on the semiconductor layer lb, which dimension is in a direction along opposed surfaces of the respective end part fa and connector electrode Eb.

Since the drain electrodes dA and dB are connected to the same liquid crystal LC, the on-current is improved in proportion to a total of the channel width WA of the TFT_A and the channel width WB of the TFT_B. Therefore, with the configuration of the display control element Ab, the on-current is improved as compared with conventional display control elements which do not include a plurality of TFTs.

(Parasitic Capacitor)

The parasitic capacitor Csg is formed in a region indicated by a region Ba in FIG. 7. Note that an electrostatic capacity of the parasitic capacitor Csg is proportional to an area, of the end part fa, in the region Ba. Furthermore, the electrostatic capacity is inversely proportional to a thickness, of the semiconductor layer lb, in the region Ba.

The sources of the respective two TFT_A and TFT_B are overlaid so as to serve as a single source electrode sa. This allows a reduction in area of the region Ba, as compared with a configuration in which the sources of the respective two TFT_A and TFT_B are not overlaid so as to serve as a single source electrode sa. This allows a reduction in electrostatic capacity of the parasitic capacitor Csg.

Furthermore, a total area of the source electrode sa is made smaller than that of the drain electrodes dA and dB. This securely allows a reduction in electrostatic capacity of the parasitic capacitor Csg formed between the source electrode and the gate line.

(Compatibility Between Maintenance of Channel Width and Reduction in Electrostatic Capacity of Parasitic Capacitor)

Two TFTs are connected in parallel to each other and sources of the respective two TFTs are overlaid so as to serve as a single source electrode s. This makes it possible to (i) keep the channel width wide and (ii) reduce the electrostatic capacity of the parasitic capacitor.

Note that the number of TFTs included in the display control element Ab (hereinafter referred to as "the number of parallel TFTs") is not limited two. Alternatively, the display control element Ab can include three or more TFTs, provided that (i) such TFTs are connected in parallel to each other and (ii) sources of the respective TFTs can be overlaid so as to serve as a single source electrode.

The electrostatic capacity of the parasitic capacitor Csg can be made smaller in proportion to an increase in number of parallel TFTs. The number of parasitic capacitors Csg is equal to the number of display control elements Ab connected to the source line SL. In a case where a liquid crystal display device including the display control element Ab is a full-HD display, it includes 1,080 parasitic capacitors Csg. Therefore, as the number of parallel TFTs increases, an effect of reducing the electrostatic capacity of the parasitic capacitor Csg becomes significant.

An increase in number of parallel TFTs also causes an increase in electrostatic capacity of a parasitic capacitor formed between a drain electrode and a gate line GL of a TFT included in the display control element Ab. However, such an electrostatic capacity merely contributes to a speed at which a pixel is charged, and will therefore not generally affect a speed at which a gate of a TFT is turned on and off, i.e., a driving speed of a liquid crystal display device including the display control element Ab.

The liquid crystal display device, including the display control element Ab, can be driven at a higher speed, particularly in a case where an improvement, in driving speed of the liquid crystal display device, which is brought about by lengthening the channel width is greater than a reduction, in driving speed of the liquid crystal display device, which is caused by an increase in electrostatic capacity of the parasitic capacitor.

[Main Points]

A display control element A or Ab in accordance with a first aspect of the present invention is a display control element which is configured to drive an active matrix display device (liquid crystal display device 1, 1a, or 1b) including source lines SL and gate lines GL, Glad, or GLb, the display control element including: a semiconductor layer 1 or lb having a gate surface (counter surface p or pb) connected to one of the gate lines; a source electrode s or sa provided on a side of the semiconductor layer and connected to one of the source lines; and drain electrodes da and db or dA and dB provided on the side of the semiconductor layer and connected to a same pixel of the active matrix display device, the gate surface, the source electrode, and each of the drain electrodes serving as a gate, a source, and a drain, respectively, so as to constitute a single thin film transistor.

(Improvement in On-Current)

An on-current of a thin film transistor is improved in proportion to an increase in channel width, which is a dimension of a section between a source electrode and a drain electrode on a semiconductor layer, which dimension is in a direction along opposed surfaces of the respective source electrode and drain electrode. This makes it possible to drive a display device at a high speed.

According to the above configuration, thin film transistors are provided based on the number of drain electrodes. Since the drain electrodes are connected to the same pixel, the on-current is improved in proportion to a total of channel widths of the respective thin film transistors. Therefore, with the above configuration, the on-current is improved as compared with conventional display control elements which do not include a plurality of thin film transistors.

(Reduction in Electrostatic Capacity of Parasitic Capacitor)

A parasitic capacitor is formed between a source electrode of a thin film transistor and a gate line of a liquid crystal display device. The parasitic capacitor has an electrostatic capacity proportional to a total area of the source electrode.

As the parasitic capacitor becomes smaller, the thin film transistor can be turned on and off at a higher speed. It is therefore possible to drive a display device at a high speed.

According to the above configuration, sources of respective thin film transistors are overlaid so as to serve as a single source electrode. This allows a reduction in total area of a source electrode as compared with a conventional display control element in which sources of respective thin film transistors are not overlaid so as to serve as a single source electrode. It is therefore possible to reduce the electrostatic capacity of the parasitic capacitor as compared with such a conventional display control element.

(Compatibility Between Improvement in On-Current and Reduction in Electrostatic Capacity of Parasitic Capacitor)

The display control element can not only improve the on-current but also reduce the electrostatic capacity of the parasitic capacitor. This makes it possible to drive a display device at a high speed.

The display control element is particularly suitable for a display device employing a field sequential driving method, which requires high-speed driving.

The display control element in accordance with a second aspect of the present invention can be configured such that, in the first aspect of the present invention, the source electrode is smaller in total area than the drain electrodes.

In a case where a source electrode and drain electrodes are provided on the same surface (hereinafter referred to as a "installation surface") of a semiconductor layer, an increase in size of one of (i) the source electrode and (ii) the drain electrodes causes a reduction in area of the installation surface for the other. This means that in a case where the total area of drain electrodes is large, there is a possibility that the installation surface has no space for the source electrode.

In contrast, according to the above configuration, the total area of the source electrode is smaller than that of the drain electrodes. This makes it possible to (i) securely provide the source electrode on the installation surface and (ii) reduce the electrostatic capacity of the parasitic capacitor formed between the source electrode and the gate line. The display control element therefore makes it possible to securely drive the display device at a high speed.

The display control element in accordance with a third aspect of the present invention can be configured such that, in the first or second aspect of the present invention, the source electrode is provided between the drain electrodes on the side of the semiconductor layer.

According to the above configuration, a channel section, of a semiconductor transistor, which faces a source electrode and drain electrodes on a semiconductor layer is provided so that the source electrode is interposed between the channel section. This allows a peripheral part of the source electrode to efficiently serve as a channel section, and therefore makes it possible to further increase the total of channel width.

An active matrix display device (liquid crystal display device 1, 1a, or 1b) in accordance with a fourth aspect of the present invention includes: source lines SL; gate lines GL, Glad, or GLb; pixel sections P; and a display control element in accordance with any one of the first through third aspect of the present invention, the gate lines being connected to a gate surface of a semiconductor layer of the display control element, the source lines being connected to a source electrode of the display control element, and the pixels being connected to each of drain electrodes of the display control element.

The active matrix display device in accordance with a fifth aspect of the present invention can be configured to further include, in the fourth aspect of the present invention, a transparent pixel electrode configured to relay each of the pixels and the drain electrodes.

The above configuration makes it possible to provide a light-transmitting region in a display region of a display device. Such a display device is suitable as a transparent display.

The "transparent display" is not limited to mean a display having a light transmittance of 100%, and can also mean a display having a light transmittance of 1% to 99%, i.e., a translucent display.

The active matrix display device in accordance with a sixth aspect of the present invention can be configured such that, in the fourth or fifth aspect of the present invention, the semiconductor layer is smaller in dimension, in a direction in which the source lines extend, than the gate lines.

The above configuration makes it possible to cause a display device to have an improved aperture ratio. Such a display device is more suitable as a transparent display.

The active matrix display device in accordance with a seventh aspect of the present invention can be configured such that, in any one of the fourth through sixth aspects of the present invention, each of the gate lines has an opening which is located so as to face the source electrode.

The above parasitic capacitor is formed in a region in which the source electrode and the gate line face each other. As such, the parasitic capacitor can be regarded as a capacitor element in which the source electrode and the gate line, serving as respective electrodes, are opposite to each other.

According to the above configuration, the gate line has an opening. This means that one of the opposed electrodes of the capacitor element does not exist. As such, there exists substantially no parasitic capacitor. This allows a further reduction in electrostatic capacity of the parasitic capacitor.

The active matrix display device in accordance with an eighth aspect of the present invention can be configured such that, in any one of the fourth through seventh aspects of the present invention, each of the gate lines has an opening which is located so as to face the drain electrodes.

The above configuration allows a further reduction in electrostatic capacity of the parasitic capacitor.

The active matrix display device in accordance with a ninth aspect of the present invention can be configured such that, in any one of the fourth through eighth aspects of the present invention, each of the gate lines has a small opening which is located so as to face a part which is doped so as to form the source electrode on the side of the semiconductor layer.

The gate line having an opening has a greater electric resistance.

According to the above configuration, there is formed substantially no parasitic capacitor in a part, of the semiconductor layer, which is not doped. As has been discussed, this parasitic capacitor can be regarded as a capacitor element in which (i) the source electrode in a doped part of the semiconductor layer and (ii) the gate line, serving as respective electrodes, are opposite to each other.

Furthermore, since the gate line has a small opening in the doped part, one of the opposed electrodes of the capacitor element does not exist. As such, there exists substantially no parasitic capacitor. The display device therefore makes it possible to (i) restrict a rise in electric resistance of the gate line and (ii) further reduce the electrostatic capacity of the parasitic capacitor.

The active matrix display device in accordance with a tenth aspect of the present invention can be configured such that, in any one of the fourth through ninth aspects of the present invention, each of the gate lines has a small opening which is located so as to face a part which is doped so as to form the drain electrodes on the side of the semiconductor layer.

The above configuration makes it possible to (i) restrict a rise in electric resistance of the gate line and (ii) further reduce the electrostatic capacity of the parasitic capacitor.

[Supplemental Notes]

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The present invention is applicable to a display device and a transparent display that employ a field sequential driving method.

REFERENCE SIGNS LIST 1, 1a, 1b: Liquid crystal display device (display device)
5: Transparent display
A, Ab: Display control element
Csg: Parasitic capacitor
GL, GLa, GLb: Gate line
LC: Liquid crystal (pixel)
O, Oa, Ob: Opening
Oc, Oca, Ocb: Small opening
P: Pixel section
SL: Source line
T: Pixel electrode
da, db, dA, dB: Drain electrode
1, 1b: Semiconductor layer
p, pb: Counter surface (gate surface)
s, sa: Source electrode

The invention claimed is:

1. An active matrix display device, comprising:
source lines;
gate lines;
pixels; and
a display control element which is configured to drive the active matrix display device,
the display control element including:
a semiconductor layer having a gate surface connected to one of the gate lines;
a source electrode provided on a side of the semiconductor layer and connected to one of the source lines; and
drain electrodes provided on the side of the semiconductor layer and connected to a same pixel among the pixels,
the gate surface, the source electrode, and each of the drain electrodes serving as a gate, a source, and a drain, respectively, so as to constitute a single thin film transistor,
each of the gate lines having an opening which is located so as to face the source electrode,
each of the gate lines having further openings which is located so as to face the respective drain electrodes.

2. The display control element as set forth in claim 1, wherein:
the source electrode is smaller in total area than the drain electrodes.

3. The display control element as set forth in claim 1, wherein:
the source electrode is provided between the drain electrodes on the side of the semiconductor layer.

4. An active matrix display device as set forth in claim 1, further comprising:
a transparent pixel electrode configured to relay (i) a liquid crystal included in each of the pixels and (ii) the drain electrodes.

5. The active matrix display device as set forth in claim 1, wherein:
the semiconductor layer is smaller in dimension, in a direction in which the source lines extend, than the gate lines.

6. An active matrix display device, comprising:
source lines;
gate lines;
pixels; and
a display control element which is configured to drive the active matrix display device,
the display control element including:
a semiconductor layer having a gate surface connected to one of the gate lines;
a source electrode provided on a side of the semiconductor layer and connected to one of the source lines; and
drain electrodes provided on the side of the semiconductor layer and connected to a same pixel among the pixels,
the gate surface, the source electrode, and each of the drain electrodes serving as a gate, a source, and a drain, respectively, so as to constitute a single thin film transistor,
each of the gate lines having a small opening which is located so as to face a part which is doped so as to form the source electrode on the side of the semiconductor layer, and
each of the gate lines having further small openings which is located so as to face respective parts which are doped so as to form the drain electrodes on the side of the semiconductor layer.

7. The display control element as set forth in claim 6, wherein:
the source electrode is smaller in total area than the drain electrodes.

8. The display control element as set forth in claim 6, wherein:
the source electrode is provided between the drain electrodes on the side of the semiconductor layer.

9. An active matrix display device as set forth in claim 6, further comprising:
a transparent pixel electrode configured to relay (i) a liquid crystal included in each of the pixels and (ii) the drain electrodes.

10. The active matrix display device as set forth in claim 6, wherein:
the semiconductor layer is smaller in dimension, in a direction in which the source lines extend, than the gate lines.

* * * * *